(12) United States Patent
Mizuno et al.

(10) Patent No.: US 6,407,644 B1
(45) Date of Patent: Jun. 18, 2002

(54) VOLTAGE CONTROLLED OSCILLATOR

(75) Inventors: Masayuki Mizuno; Koichiro Minami, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/664,411

(22) Filed: Sep. 18, 2000

(30) Foreign Application Priority Data

Sep. 20, 1999 (JP) ............................................. 11-266202

(51) Int. Cl.[7] ................................................ H03B 5/24
(52) U.S. Cl. ..................... 331/57; 331/175; 331/177 R; 331/34
(58) Field of Search ...................... 331/57, 175, 177 R, 331/34

(56) References Cited

U.S. PATENT DOCUMENTS 5,821,824 A * 10/1998 Mentzer ...................... 331/57

FOREIGN PATENT DOCUMENTS

| JP | 6-104638 | 4/1994 |
|---|---|---|
| JP | 6-295584 | 10/1994 |
| JP | 7-336216 | 12/1995 |
| JP | 8-18444 | 1/1996 |
| JP | 9-200050 | 7/1997 |

* cited by examiner

Primary Examiner—Arnold Kinkead
(74) Attorney, Agent, or Firm—Sughrue Mion, PLLC

(57) ABSTRACT

A voltage controlled oscillator operates over a wide operating frequency range and reduces the fluctuation of the gain due to the fluctuation of the frequency characteristic. The variable frequency oscillator includes a first voltage/current converter for controlling the variable frequency oscillator such that the output oscillating frequency is varied by $\Delta F$ hertz by changing the input voltage by $\Delta V$ volt when the input voltage is less than a prescribed threshold voltage, and includes a second voltage/current converter for controlling the variable frequency oscillator such that the output oscillating frequency is varied by more than $\Delta F$ hertz by changing the input voltage by $\Delta V$ volt, when the input voltage exceeds a prescribed threshold voltage.

8 Claims, 5 Drawing Sheets

Fig. 5A  Fig. 5B
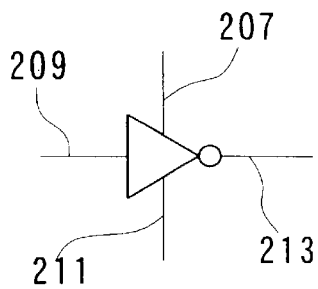
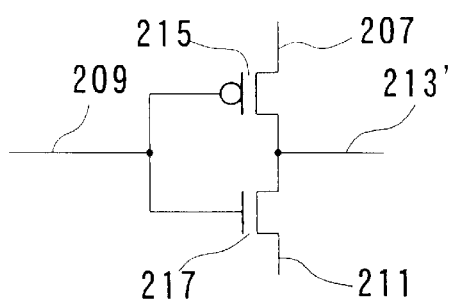
Fig. 6 (PRIOR ART)
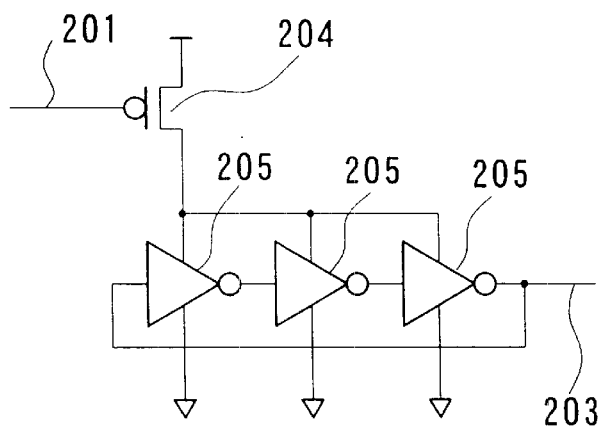
Fig. 7 (PRIOR ART)
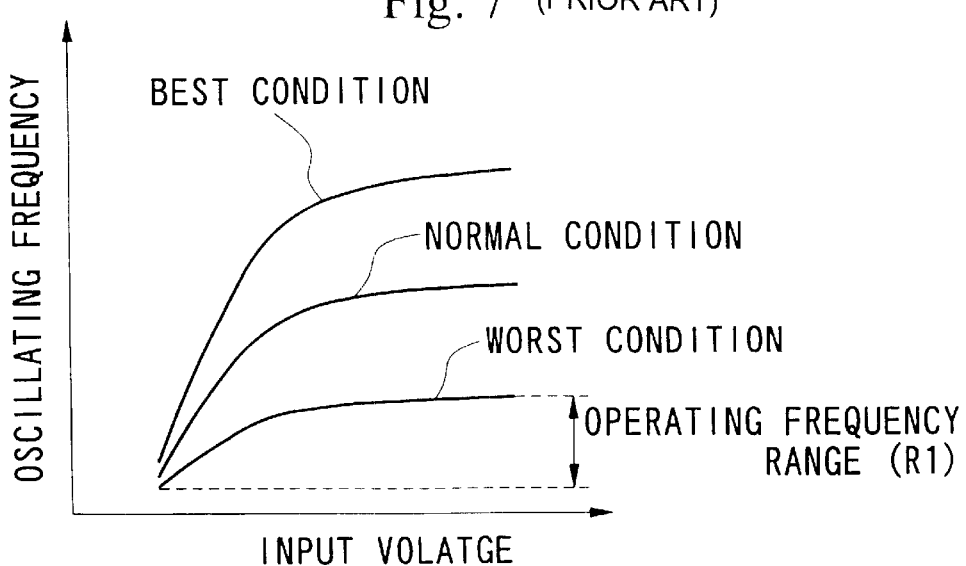

VOLTAGE CONTROLLED OSCILLATOR

BACKGROUND OF THE INVENTION

1. Field of the Invention

The present invention relates to an IC (Integrated Circuit)-type voltage controlled oscillator, and more particularly relates to a voltage controlled oscillator capable of preventing contraction of the operating frequency range caused by fluctuations of the frequency characteristics of each circuit due to fluctuations of the manufacturing conditions and variations of the operating temperature and the power source voltage.

2. Background Art

Conventionally, a voltage controlled oscillator which controls the output oscillating frequency in response to the change of the input voltage, is used in a variety of circuits. In conventional voltage controlled oscillators, the output oscillating frequency increases or decreases by ΔF (Hz) monotonously with an increment ΔV of the input voltage.

When a source voltage of 5V is used for such conventional circuits, a desirable input voltage-output frequency characteristic (which is called "the frequency characteristic", hereinafter) is obtained by obtaining the output oscillating frequency by incrementing the input voltage into the variable frequency oscillator shown in FIG. 6, using an inverter shown in FIG. 5.

However, as the integrated circuits becomes finer and their operating speed increases, the source voltage turns to a lower voltage such as a voltage of 2V or lower. In such a case, the operation of the variable frequency oscillator is liable to be saturated, and the relationship between the input voltage and the oscillating frequency begins to lose a linearity as shown in FIG. 7.

Fluctuations in the manufacturing conditions and variations in the operating temperature and the source voltage cause the frequency characteristic of voltage controlled oscillators to fluctuate and the best frequency characteristic is obtained for products, in which the manufacturing and environmental conditions are optimal, and the worst frequency characteristic is encountered for products under most unfavorable manufacturing and environmental conditions. That is, the frequency characteristic for a product subjected to optimal conditions (called the best condition) differs from that of a product subject to the most unfavorable conditions (called worst condition) as shown in FIG. 7.

Recently, as shown above, the frequency characteristic of IC-type voltage controlled oscillators tends to fluctuate due to the very small scale manufacturing process of devices constituting such voltage controlled oscillators and the lowered source voltage; and a first problem arises in that the operating frequency range becomes narrower as a result of the above-described tendency.

In order to obtain the broad operating frequency range of the frequency characteristic shown in FIG. 7, it is necessary to increase the gain, ΔF/ΔV, i.e., the rate of change ΔF of the oscillating frequency when the input voltage is incremented by ΔV.

However, since the analog potential is input into the input terminal of the voltage controlled oscillator, a simple increase in the gain generates an increase in the jitter, which is fluctuation of the oscillating frequency of a signal obtained from the output terminal.

When considering the variation of the frequency characteristics obtained over the range of the most unfavorable conditions (the worst condition) to the optimal conditions (the best condition), if the gain is set to an optimum value when the conditions are most unfavorable, a second problem arises in that the gain determined under the optimal conditions will be excessively large, and the above-described jitter will increase.

SUMMARY OF THE INVENTION

It is therefore an object of the present invention to provide a voltage controlled oscillator capable of being operated over a wide frequency range and with reduced fluctuation of the gain due to the fluctuation of the frequency characteristic.

The first aspect of the present invention provides a voltage controlled oscillator, which controls the output frequency by changing the input voltage, comprising: a variable frequency oscillator, whose oscillating frequency is controlled by the input signal; and a control device for controlling, said variable frequency oscillator such that a change of said input voltage by ΔV volts changes the output frequency by ΔF Hz, when said input voltage is equal to or less than a predetermined threshold voltage; and for controlling said variable frequency oscillator such that the change of said input voltage by ΔV volts changes the output frequency by more than ΔF Hz, when said input voltage exceeds a predetermined threshold voltage.

According to the second aspect of the present invention, in the voltage controlled oscillator according to the first aspect, the controlling device comprises a first voltage/current converter in which an output current changes in response to the change of the input voltage and a second voltage/current converter in which the output current changes in response to the change of the input voltage, when the input voltage exceeds the predetermined threshold voltage; wherein the variable frequency oscillator is controlled by the currents from the first and the second voltage/current converters.

According to the third aspect of the present invention, in the voltage controlled oscillator according to the second aspect, the second voltage/current converter is a voltage/current controller having a variable threshold voltage.

According to the fourth aspect of the present invention, in the voltage controlled oscillator according to the second aspect, the second voltage/current converter is comprised of a plurality of voltage/current controllers, each having a different threshold voltage.

When it is assumed that a voltage of the input terminal for a desired oscillating frequency of $F_{OUT}$ is $V_{IN}$, and when the variation of the gain due to the fluctuation of the frequency characteristic of the oscillator is considered, the input voltage for obtaining a desired oscillating frequency $F_{OUT}$ is larger than $V_{IN}$ under the least favorable or the worst condition, and the input voltage becomes smaller than $V_{IN}$ at the time of the optimal or the best condition.

This is because the gain is smaller when the condition is most unfavorable or worst, and the gain is larger when the conditions are best, when compared to the gain under the normal condition.

For example, when it is assumed that the input voltage is equal to the $V_{IN}$, under the most unfavorable conditions, the gain is increased in the vicinity of the desired frequency $F_{OUT}$ by the second voltage/current converter. That is, the variation of the gain due to the fluctuation of the frequency characteristics can be reduced.

In addition, the reduction of the change of the gain makes it possible to prevent a contraction of the operating frequency range.

When the input voltage exceeds a predetermined threshold voltage, variation of the gain can be further reduced by the use of a plurality of the second voltage/current converters and the use of a plurality of threshold voltages can expand the operating frequency range.

BRIEF DESCRIPTION OF THE DRAWINGS

FIGS. 5A and 5B are circuit diagrams showing the internal circuit of the inverter.

FIG. 6 is a circuit diagram showing the structure of a conventional voltage controlled circuit.

FIG. 7 is a diagram showing the frequency characteristic corresponding to the relationship between the input voltage and the output oscillating frequency of a conventional voltage controlled oscillator.

DETAILED DESCRIPTION OF THE INVENTION

Hereinafter, first and second embodiments of the present invention are described in detail with reference to the drawings.

First Embodiment

Figure 1:
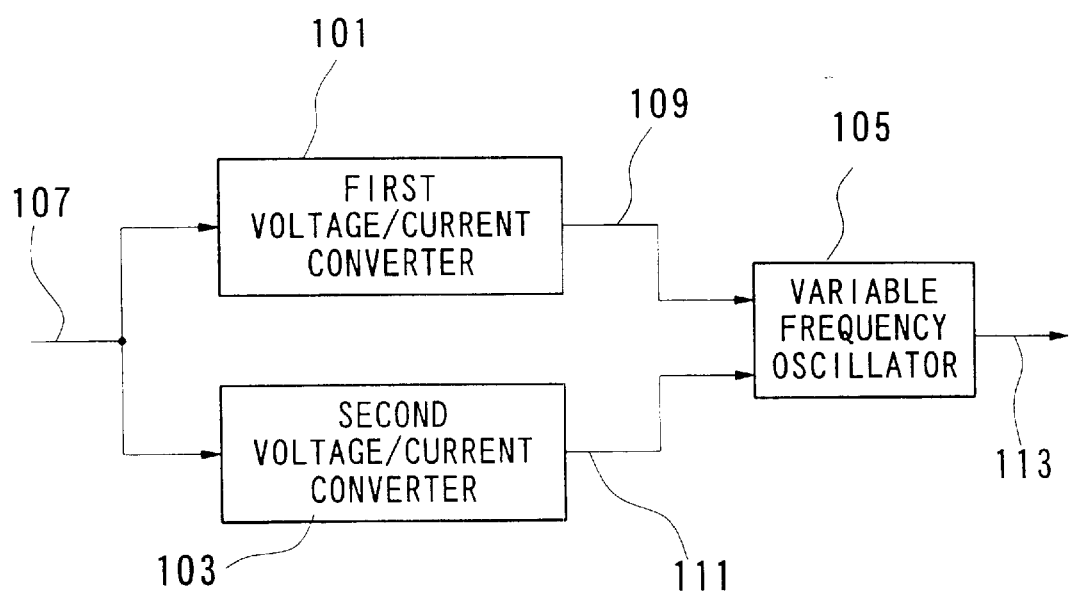
FIG. 1 is a block diagram showing the structure of a voltage controlled oscillator according to the first embodiment of the present invention.
Figure 2:
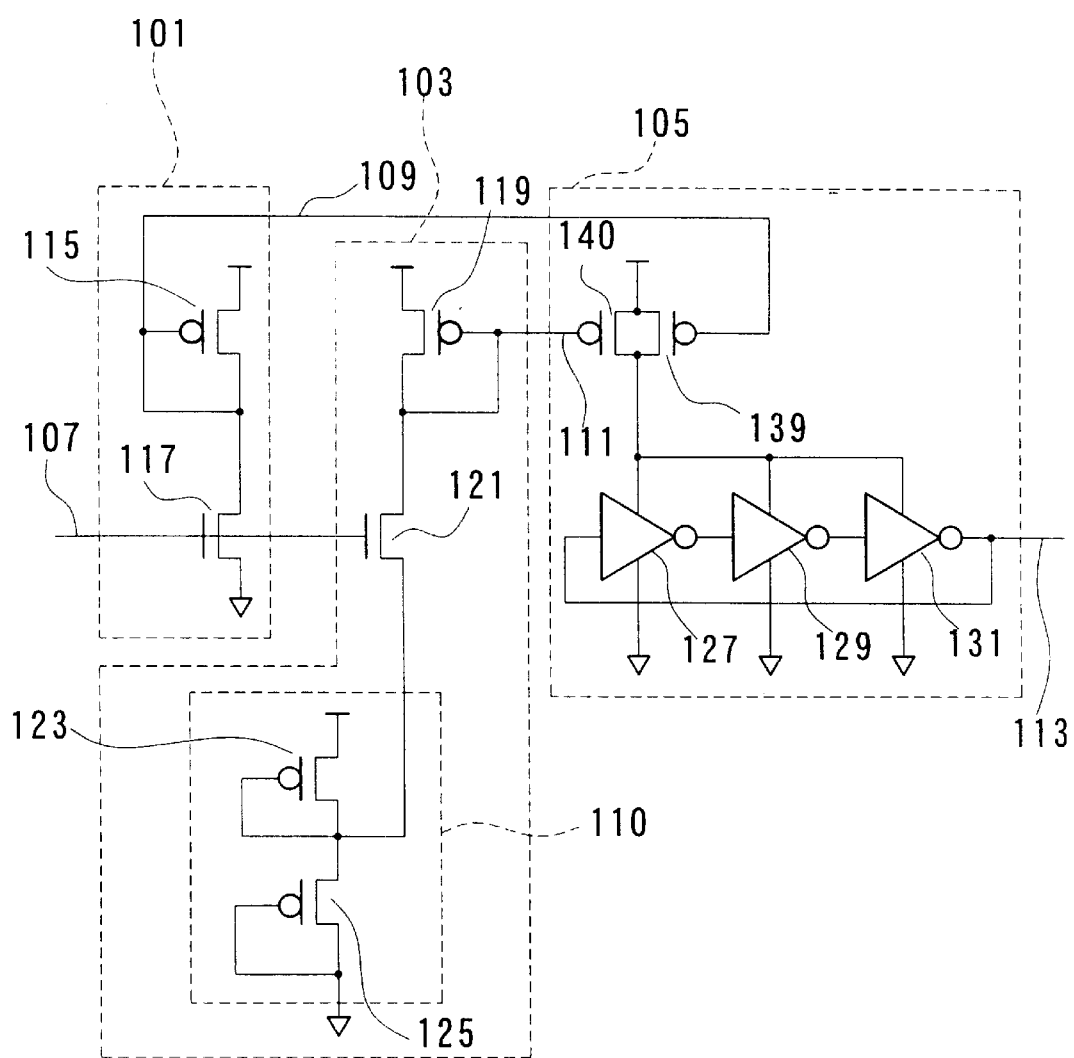
FIG. 2 is a circuit diagram showing the internal structure of the voltage controlled oscillator shown in FIG. 1.
Figure 3:
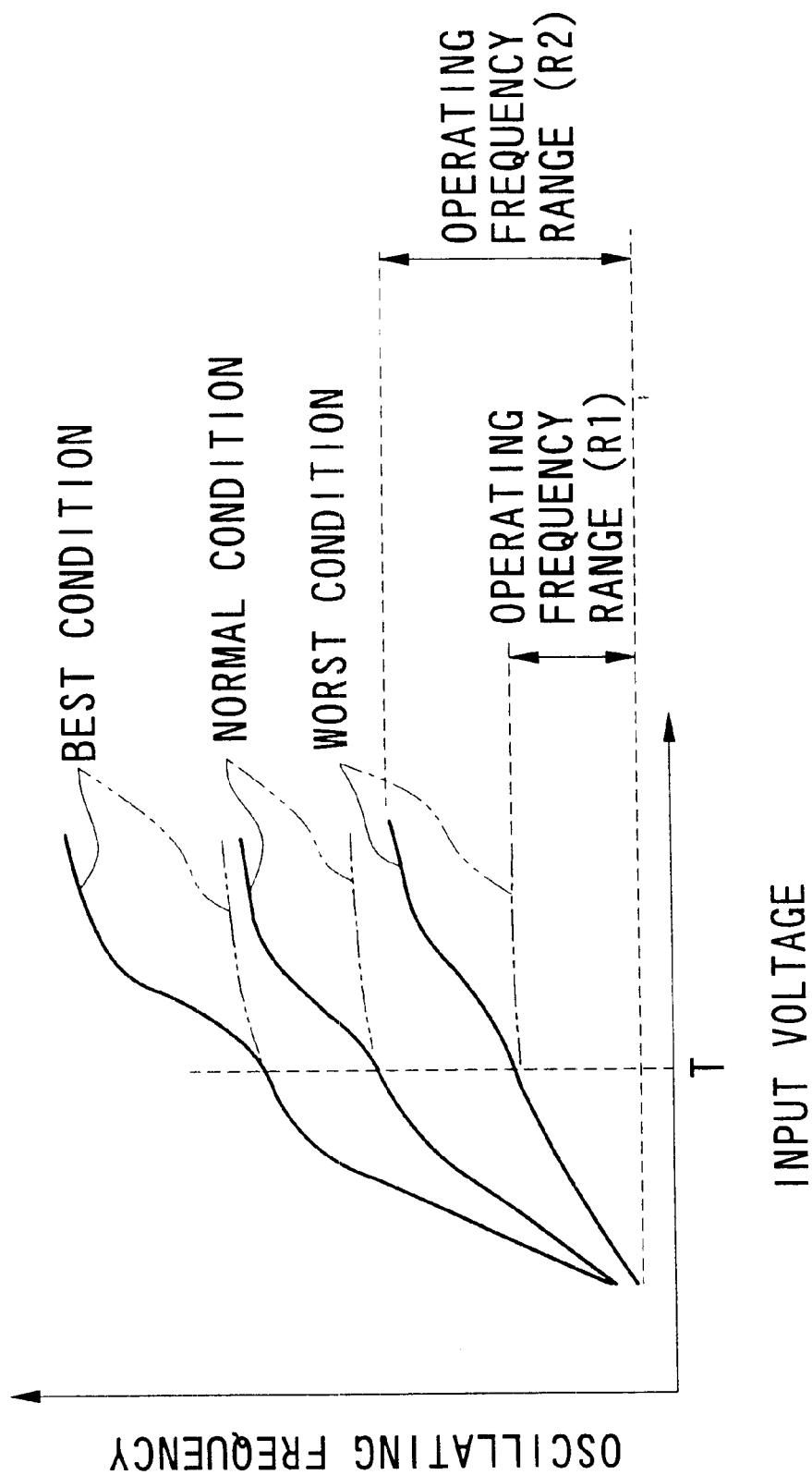
FIG. 3 is a diagram showing the frequency characteristic corresponding to the relationship between the input voltage and the output oscillating frequency of the voltage controlled oscillator according to the first embodiment of the present invention.

FIG. 1 is a block diagram showing the structure of a voltage controlled oscillator according to the first embodiment of the present invention, and FIG. 2 is a circuit diagram showing the internal structure of the voltage controlled oscillator shown in FIG. 1. In addition, FIG. 3 is a diagram showing the characteristic relationship between the input voltage and the output oscillating frequency of the voltage controlled oscillator according to the first embodiment of the present invention.

In FIG. 1, reference numeral 101 denotes a first voltage/current converter, in which an output current changes in response to a variation of an input voltage, 103 denotes a second voltage/current converter, in which an output current changes in response to a variation of an input voltage, and an output frequency of the variable frequency oscillator 105 is controlled by use of outputs of the first and second voltage/current converters 101 and 103.

In FIG. 2 showing the internal circuit, a control voltage input from 107 is input into the first voltage/current converter 101 and the second voltage/current converter 103, and thereafter input into a transistor 139 and a transistor 140 of the variable frequency oscillator 105.

Here, the second voltage/current converter 103 comprises a threshold voltage setting circuit 110 provided with two transistors 123 and 125, and this second voltage/current converter 103 starts operation from the point in time that the input voltage exceeds a prescribed set threshold voltage T volt (generally, ½ of the source voltage).

In the range in which the input voltage is equal to or lower than the prescribed threshold voltage of T volt, only the first voltage/current converter operates and controls the oscillating frequency of the oscillator constituted by three inverters 127, 129, and 131, by driving the transistor 139 by the output signal 109 of the first voltage/current converter 101.

In the range in which the input voltage exceeds the prescribed threshold voltage of T volt, the second voltage/current converter 103 starts operation and controls the frequency of the oscillator together with the transistor 139 connected in parallel with the transistor 140, by driving the transistor 140 by the output signal 111.

Therefore, in the range in which the input voltage exceeds the threshold voltage T, the frequency gain is increased, and as a result, the linearity in the relationship between the input voltage and the output oscillating frequency is improved.

FIG. 3 is a diagram showing the frequency characteristic corresponding to the relationship between the input voltage and the output oscillating frequency. In a range in which the input voltage exceeds T volts, the frequency characteristics of the present voltage controlled oscillator are shown by the solid lines, and the frequency characteristics of the conventional oscillator are shown by broken lines.

In the range in which the input voltage exceeds T volts, the linearity of the characteristic relationship between the input voltage and the output frequency is considerably improved due to the second voltage/current converter 103. In addition, the operating frequency range is also largely improved compared to that of the conventional technique.

The change of the gain due to the variation of the frequency character is considerably reduced, and the difference of the gains between the best condition and the condition is also considerable reduced.

Second Embodiment

Hereinafter, the second embodiment of the present invention is described with reference to FIG. 4. The second embodiment differs from the first embodiment in the constitution of the threshold voltage setting circuit in the second voltage/current converter 110. Thus, the components of the voltage controlled oscillator according to the second embodiment are denoted by the same numerals except for the threshold voltage setting circuit 150.

Figure 4:
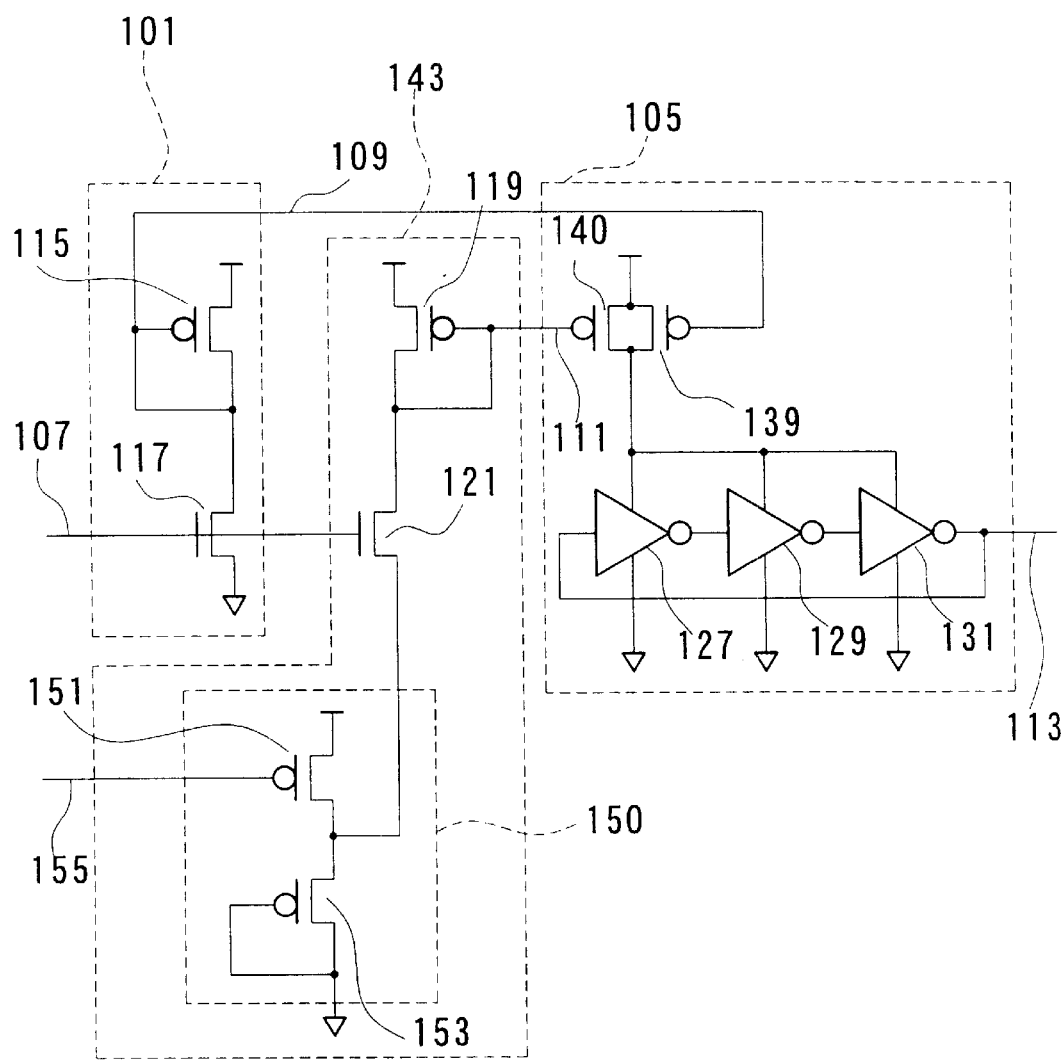
FIG. 4 is a block diagram showing the structure of a voltage controlled oscillator according to the second embodiment of the present invention.

In FIG. 4, a gate terminal 155 of a transistor 151, which is one of two transistors constituting the threshold voltage setting circuit 150, is moved to the outside, and since it is possible to control the voltage at the connecting point of both transistors 151 and 153, the second voltage/current converter 143 starts operation when a control voltage, exceeding the voltage at the connecting point of both transistors, is applied from 107 and controls the oscillating frequency of the variable frequency oscillator 105.

In the range in which the input voltage is less than the threshold voltage and the second voltage/current converter 143 does not operate, only the first voltage/current converter 101 controls the variable frequency oscillator 105 for controlling the output oscillating frequency.

Thus, in the range in which the input voltage exceeds the threshold voltage, the first voltage/current converter 101 and the second voltage/current converter 143 operate together to control the variable frequency oscillator with a high gain, so that the operational saturation of the oscillating circuit can be compensated and the operating frequency range can be expanded.

Furthermore, although not shown, it is possible to make the control device execute an ideal control operation by the use of a plurality of voltage/current converters each provided with varied threshold voltages for suppression of the contraction of the operating frequencies due to the fluctuation of the frequency characteristic.

Although the present invention has been described in detail, the present invention is not limited to the two embodiments described above, but variants thereof can be envisaged which do not exceed the scope of the invention.

As described above, since the present voltage controlled oscillator is constituted such that the gain increases when the input voltage exceeds a prescribed value, the effect is obtained that it becomes possible to prevent the contraction of the operating frequency range and the fluctuation of the gain due to the fluctuation of the frequency characteristics by compensating the saturation of operation of the oscillating circuit.

What is claimed is:

1. A voltage controlled oscillator having an output frequency that is controlled by incrementing an input voltage of the oscillator, comprising:

a variable frequency oscillator, whose oscillating frequency is controlled by an input signal; and a control device operative to generate the input signal for controlling the variable frequency oscillator such that an incremental change of the input voltage changes the output frequency by $\Delta F$ hertz when the input voltage is equal to or less than a predetermined threshold voltage, and for controlling the variable frequency oscillator such that the incremental change of the input voltage changes the output frequency by more than $\Delta F$ hertz, when the input voltage exceeds a predetermined threshold voltage, the control device comprising:

a first voltage/current converter in which an output current changes in response to the change of the input voltage; and a second voltage/current converter in which the output current changes in response to the change of the input voltage, when the input voltage exceeds the predetermined threshold voltage;

wherein the variable frequency oscillator is controlled by the currents from the first and the second voltage/current converters;

and wherein the second voltage/current converter is a voltage/current converter having a variable threshold voltage.

2. A voltage controlled oscillator according to claim 1, wherein the second voltage/current converter comprises a plurality of voltage/current controllers, each having a different variable threshold voltage.

3. A voltage controlled oscillator having an output frequency that is controlled by incrementing an input voltage to the voltage controlled oscillator, comprising:

a variable frequency oscillator, whose output frequency is controlled by an input signal; and a control device operative to generate the input signal for controlling said variable frequency oscillator such that an incremental change of said input voltage changes the output frequency by $\Delta F$ hertz when said input voltage is equal to or less than a single predetermined threshold voltage, and for controlling said variable frequency oscillator such that the incremental change of said input voltage changes the output frequency by more than $\Delta F$ hertz when said input voltage exceeds said predetermined threshold voltage, the control device comprising:

a first voltage/current converter having a first output current that changes in response to the change of the input voltage; and a second voltage/current converter comprising a threshold voltage setting circuit operative to obtain the input voltage and generate the predetermined threshold voltage based on the input voltage, the second voltage/current converter having a second output current that changes in response to the change of the input voltage when the input voltage exceeds the predetermined threshold voltage;

wherein the variable frequency oscillator is controlled by the first and second output currents from the first and the second voltage/current converters.

4. A voltage controlled oscillator according to claim 3, wherein the first voltage/current converter comprises a first pair of field effect transistors configured in a series arrangement.

5. A voltage controlled oscillator according to claim 3, wherein the second voltage/current converter comprises a second pair of field effect transistors configured in a series arrangement;

and wherein said threshold voltage setting circuit comprises a third pair of field effect transistors configured in a series arrangement.

6. A voltage controlled oscillator according to claim 3, wherein the second voltage/current converter comprises a second pair of field effect transistors configured in a series arrangement;

and wherein said threshold voltage setting circuit comprises a pair of field effect transistors configured in a series arrangement, so that the second voltage/current converter generates the second output current.

7. A voltage controlled oscillator according to claim 3, wherein the second voltage/current converter comprises a plurality of voltage/current controllers, each having a different threshold voltage.

8. A voltage controlled oscillator according to claim 6, wherein the threshold voltage setting circuit has a variable threshold voltage.

* * * * *